United States Patent
Carcasi et al.

(10) Patent No.: US 11,163,236 B2
(45) Date of Patent: Nov. 2, 2021

(54) METHOD AND PROCESS FOR STOCHASTIC DRIVEN DETECTIVITY HEALING

(71) Applicant: Tokyo Electron Limited, Tokyo (JP)

(72) Inventors: Michael Carcasi, Austin, TX (US); Seiji Nagahara, Tokyo (JP); Congque Dinh, Kumamoto (JP); Mark Somervell, Hillsboro, OR (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/993,594

(22) Filed: Aug. 14, 2020

(65) Prior Publication Data

US 2021/0048749 A1 Feb. 18, 2021

Related U.S. Application Data

(60) Provisional application No. 62/888,049, filed on Aug. 16, 2019.

(51) Int. Cl.
G03F 7/20 (2006.01)

(52) U.S. Cl.
CPC ............ G03F 7/2026 (2013.01); G03F 7/203 (2013.01); G03F 7/2024 (2013.01); G03F 7/2045 (2013.01)

(58) Field of Classification Search
CPC ...... G03F 7/7026; G03F 7/2024; G03F 7/203; G03F 7/2045
USPC .......................................................... 355/27
See application file for complete search history.

(56) References Cited

U.S. PATENT DOCUMENTS

| | | | |
|---|---|---|---|
| 4,402,571 | A | 9/1983 | Cowan |
| 4,609,615 | A | 9/1986 | Yamashita |
| 4,657,843 | A | 4/1987 | Fukuyama |
| 4,751,169 | A | 6/1988 | Behringer |

(Continued)

FOREIGN PATENT DOCUMENTS

| | | |
|---|---|---|
| CN | 101738872 B | 4/2013 |
| EP | 583205 A | 2/1994 |

(Continued)

OTHER PUBLICATIONS

PCT International Search Report issued in counterpart PCT application PCT/US2020/045931, dated Nov. 25, 2020.

(Continued)

*Primary Examiner* — Hung Nguyen
(74) *Attorney, Agent, or Firm* — Wood Herron & Evans LLP

(57) ABSTRACT

Substrate processing techniques to alleviate missing contact holes, scummed contact holes and scummed caused bridging are disclosed. In one embodiment, electromagnetic radiation (EMR) absorbing molecules are utilized in a process that uses an initial patterned exposure followed by a flood exposure. In one embodiment, a Photo-Sensitized Chemically-Amplified Resist (PSCAR) resist process is utilized to form contact holes in which an initial exposure and develop process is performed followed by a flood exposure and a second develop process. In another embodiment, a process is utilized in which precursors of EMR absorbing molecules are incorporated into a layer underlying the resist layer. Thus, enhanced formation of EMR absorbing molecules will result at the interface of the resist layer and the underlying layer.

24 Claims, 11 Drawing Sheets

(56) References Cited

U.S. PATENT DOCUMENTS

| | | |
|---|---|---|
| 4,804,612 A | 2/1989 | Asaumi |
| 4,931,380 A | 6/1990 | Owens |
| 4,933,263 A | 6/1990 | Okuda |
| 5,370,973 A | 12/1994 | Nishii |
| 5,534,970 A | 7/1996 | Nakashima |
| 5,707,784 A | 1/1998 | Oikawa |
| 5,770,523 A | 6/1998 | Hung |
| 5,820,679 A | 10/1998 | Yokoyama |
| 5,905,019 A | 5/1999 | Obszarny |
| 6,009,888 A | 1/2000 | Ye |
| 6,180,320 B1 | 1/2001 | Saito |
| 6,242,160 B1 | 6/2001 | Fukuzawa |
| 6,245,492 B1 | 6/2001 | Huang |
| 6,271,147 B1 | 8/2001 | Tseng |
| 6,296,985 B1 | 10/2001 | Mizutani |
| 6,331,383 B1 | 12/2001 | Sakai |
| 6,440,632 B2 | 8/2002 | Yasuda |
| 6,555,479 B1 | 4/2003 | Hause |
| 6,576,714 B2 | 6/2003 | Saeki |
| 6,607,991 B1 | 8/2003 | Livesay |
| 6,844,135 B2 | 1/2005 | Kon |
| 6,900,001 B2 | 5/2005 | Livesay |
| 6,968,253 B2 | 11/2005 | Mack |
| 7,142,941 B2 | 11/2006 | Mack |
| 7,327,436 B2 | 2/2008 | Fukuhara |
| 7,488,933 B2 | 2/2009 | Ye |
| 7,829,269 B1 | 11/2010 | Fonseca |
| 7,858,289 B2 | 12/2010 | Yamashita |
| 7,966,582 B2 | 6/2011 | Melvin, III |
| 8,088,548 B2 | 1/2012 | Houlihan |
| 8,428,762 B2 | 4/2013 | Graves |
| 8,443,308 B2 | 5/2013 | Shiely |
| 8,589,827 B2 | 11/2013 | Biafore |
| 8,795,952 B2 | 8/2014 | Somervell |
| 9,009,647 B2 | 4/2015 | Ye |
| 9,454,081 B2 | 9/2016 | Somervell |
| 9,519,227 B2 | 12/2016 | Carcasi |
| 9,618,848 B2 | 4/2017 | Carcasi |
| 9,645,495 B2 | 5/2017 | Devilliers |
| 9,746,774 B2 | 8/2017 | Carcasi |
| 10,096,528 B2 | 10/2018 | Devilliers |
| 10,522,428 B2 | 12/2019 | Devilliers |
| 10,551,743 B2 | 2/2020 | Carcasi |
| 2001/0001080 A1 | 5/2001 | Eldridge |
| 2002/0030800 A1 | 3/2002 | Nellissen |
| 2002/0102490 A1 | 8/2002 | Ito |
| 2002/0123240 A1 | 9/2002 | Gallagher |
| 2003/0049571 A1 | 3/2003 | Hallock |
| 2003/0114010 A1 | 6/2003 | Jung |
| 2003/0163295 A1 | 8/2003 | Jakatdar |
| 2004/0008864 A1 | 1/2004 | Watson |
| 2004/0152024 A1 | 8/2004 | Livesay |
| 2004/0171761 A1 | 9/2004 | Kim |
| 2005/0008864 A1 | 1/2005 | Ingen Schenau |
| 2005/0214674 A1 | 9/2005 | Sui |
| 2005/0224923 A1 | 10/2005 | Daley |
| 2005/0250055 A1 | 11/2005 | Hishiro |
| 2005/0284502 A1 | 12/2005 | Watanabe |
| 2006/0040208 A1 | 2/2006 | Tarutani |
| 2006/0124586 A1 | 6/2006 | Kobayashi |
| 2006/0234516 A1 | 10/2006 | Hong |
| 2006/0269879 A1 | 11/2006 | Elian |
| 2007/0009839 A1 | 1/2007 | Harumoto |
| 2007/0032896 A1 | 2/2007 | Ye |
| 2007/0048483 A1* | 3/2007 | Stinson ............. G11B 7/252 428/64.1 |
| 2007/0048675 A1 | 3/2007 | Chang |
| 2007/0172584 A1 | 7/2007 | Kihara |
| 2007/0184648 A1 | 8/2007 | Yoon |
| 2007/0272653 A1 | 11/2007 | Wakita |
| 2007/0275330 A1 | 11/2007 | Bailey |
| 2007/0292770 A1 | 12/2007 | Strauss |
| 2008/0038675 A1 | 2/2008 | Nagasaka |
| 2008/0179753 A1 | 7/2008 | Won |
| 2008/0230722 A1 | 9/2008 | Elian |
| 2009/0011601 A1 | 1/2009 | Sugeta |
| 2009/0162796 A1 | 6/2009 | Yun |
| 2009/0214985 A1 | 8/2009 | Kulp |
| 2009/0274974 A1 | 11/2009 | Abdallah |
| 2010/0119972 A1 | 5/2010 | Houlihan |
| 2010/0181656 A1 | 7/2010 | Daley |
| 2010/0213580 A1 | 8/2010 | Meador |
| 2010/0245790 A1 | 9/2010 | Seltmann |
| 2010/0273099 A1 | 10/2010 | Fonseca |
| 2010/0291490 A1 | 11/2010 | Tsuruda |
| 2010/0316960 A1 | 12/2010 | Duerig |
| 2011/0043791 A1 | 2/2011 | Smilde |
| 2011/0147984 A1 | 6/2011 | Cheng |
| 2011/0171569 A1 | 7/2011 | Nishimae |
| 2011/0177464 A1 | 7/2011 | Takeda |
| 2011/0205505 A1 | 8/2011 | Somervell |
| 2011/0250540 A1 | 10/2011 | Huang |
| 2013/0084532 A1 | 4/2013 | Wu |
| 2013/0164691 A1 | 6/2013 | Shiobara |
| 2013/0171571 A1 | 7/2013 | Dunn |
| 2013/0204594 A1 | 8/2013 | Liu |
| 2013/0232457 A1 | 9/2013 | Ye |
| 2013/0234294 A1 | 9/2013 | Hu |
| 2013/0260313 A1 | 10/2013 | Allen |
| 2014/0227538 A1 | 8/2014 | Baldwin |
| 2015/0214056 A1 | 7/2015 | Xu |
| 2015/0241781 A1 | 8/2015 | Carcasi |
| 2015/0241782 A1 | 8/2015 | Scheer |
| 2015/0241783 A1* | 8/2015 | Carcasi ............. G03F 7/2004 430/324 |
| 2015/0241793 A1 | 8/2015 | Carcasi |
| 2016/0004160 A1 | 1/2016 | Tagawa |
| 2016/0048080 A1 | 2/2016 | Devilliers |
| 2016/0357103 A1* | 12/2016 | Nagahara ............. C07C 309/07 |
| 2016/0363868 A1 | 12/2016 | Somervell |
| 2017/0052448 A1 | 2/2017 | Nakagawa |
| 2017/0052449 A1 | 2/2017 | Nakagawa |
| 2017/0052450 A1 | 2/2017 | Nakagawa |
| 2017/0192357 A1 | 7/2017 | Carcasi |
| 2017/0242342 A1 | 8/2017 | Carcasi |
| 2017/0242344 A1 | 8/2017 | Carcasi |
| 2017/0329229 A1 | 11/2017 | Carcasi |
| 2017/0330806 A1 | 11/2017 | Devilliers |
| 2018/0315596 A1 | 11/2018 | Scheer |
| 2018/0356731 A1 | 12/2018 | Tagawa |

FOREIGN PATENT DOCUMENTS

| | | |
|---|---|---|
| EP | 2048700 A2 | 4/2009 |
| JP | 04239116 A | 8/1992 |
| JP | 09211871 A | 8/1997 |
| JP | 2000208408 A | 7/2000 |
| JP | 2002006512 A | 1/2002 |
| JP | 2007501431 A | 1/2007 |
| JP | 2007334036 A | 12/2007 |
| JP | 2013140319 A | 7/2013 |
| JP | 2013228447 A | 11/2013 |
| JP | 2014029435 A | 2/2014 |
| JP | 2015172741 A | 10/2015 |
| KR | 20120058572 A | 6/2012 |
| TW | 273457 B | 2/2007 |
| TW | 201539539 A | 10/2015 |
| TW | 201541194 A | 11/2015 |
| WO | 2003001297 A2 | 1/2003 |
| WO | 2005013007 A1 | 2/2005 |
| WO | 2008084440 A1 | 7/2008 |
| WO | 2013007442 A1 | 1/2013 |
| WO | 2018074382 A1 | 4/2018 |

OTHER PUBLICATIONS

Belloncle et al. "Study of in vitro degradation of poly(ethyl glyoxylate)", Polymer Degradation and Stability v93, 2009, pp. 1151-1157.

Belloncle et al. "Synthesis and Degradation of Poly(ethyl glyoxylate)", in chapter 4 of "Polymer Degradation and Performance", Jan. 1, 2009, pp. 41-51, ACS Symposium Series, American Chemical Society, Washington DC, US.

(56) References Cited

OTHER PUBLICATIONS

Brachais et al., "In Vitro Degradation of Poly(methyl glyoxylate) in Water", Polymer, Jun. 18, 1996, pp. 883-890, vol. 39, No. 4, Elsevier, Amsterdam, NL.

Brewer Science, "Understanding Brewer Science ARC Products", Brewer Science (23 pages, 2002).

IBM Corp., "Aqueous-Base Developable, Three-Component Resist Systems for Thick Resist Applications", IBM Technical Disclosure Bulletin, Oct. 1, 1989, NA891025, vol. 32, iss 5A, pp. 25.

Kang et al., "Critical Dimension Conlrol in Photolithography based on the Yield by a Simulation Program", Microelectronics Reliability vol. 46, pp. 1006-1012, 2006.

Lowes et al., "Comparative Study of Photosensitive versus Non-photosensitive Developer-Soluble Bottom Anti-Reflective Coating System", ECS Transactions 27(1), pp. 503-508, (2010).

Nagahara et al., "Challenge Toward Breakage of RLS Trade-off for EUV Lithography by Photosensitized Chemically Amplified Resist (PSCAR) with Flood Exposure", SPIE International Society for Optical Engineering Proceedings, vol. 9776, Mar. 18, 2016, 18pp.

Rawe, "Light-Associated Reactions of Synthetic Polymers", Springer Science-Business Media, ISBN 037318038, pp. 23-25, 2006.

Tagawa et al. "Super High Sensitivity Enhancement by Photo-Sensitized Chemically Amplified Resist Process", Journal of Photopolymer Science and Technology, vol. 26, No. 6 (2013), pp. 825-830.

Tagawa et al., "New Sensitization Method of Chemically Amplified EUV/EB Resists", presented at the 2013 International Symposium on EUV Lithography, Toyama, Japan, Oct. 6-10, 2013.

Tsuda et al., "Acid-Catalyzed Degradation Mechanism of Poly(phthalaldehyde): Unzipping reaction of Chemical Amplification Resist", Journal of Polymer Science: Part A: Polymer Chemistry. Jan. 15, 1997, pp. 77-89, vol. 35, iss 1, Wiley, New York, US.

Wang et al., "Photobase Generator and Photo Decomposable Quencher for High-Resolution Photoresist Applications", SPIE International Society for Optical Engineering Proceedings, vol. 7639, Mar. 29, 2010, 16pp.

\* cited by examiner

METHOD AND PROCESS FOR STOCHASTIC DRIVEN DETECTIVITY HEALING

The present application is related to and claims priority to U.S. Provisional Patent Application No. 62/888,049, filed on Aug. 16, 2019, entitled "Method and Process for Stochastic Driven Defectivity Healing", the contents of which are herein incorporated by reference in their entirety.

BACKGROUND

The present disclosure relates to the processing of substrates. In particular, it provides a novel method for healing patterning defects during the processing of substrates.

As geometries in substrate processing continue to shrink, the technical challenges to forming structures on substrates via photolithography techniques increase. As requirements for smaller geometry structures arose, a variety of photolithography techniques have been utilized for achieving suitable photolithography for such structures, including extreme ultraviolet (EUV) lithography (lithography utilizing wavelengths of electromagnetic radiation (EMR) in the EUV range, most typically 13.5 nm wavelengths), multiple patterning schemes (such as self-aligned double patterning (SADP), self-aligned triple patterning (SATP), etc.), argon fluoride (ArF) lithography, or other small geometry patterning methods.

One technique for small geometry lithography patterning involves the use of Photo-Sensitized Chemically-Amplified Resist (PSCAR). Particularly with use of EUV lithography, ArF lithography and multiple patterning lithography, PSCAR techniques have been useful to provide improved patterning with fewer defects. PSCAR, like traditional Chemically-Amplified resist (CAR), utilizes acid generated within the resist feature for deprotection, but acid is generated in a two-step illumination process, unlike CAR where only a single patterned exposure is used.

In one exemplary PSCAR technique, a first EUV patterned exposure is used to generate a pattern (latent image within the resist) with a relatively small amount of generated acid, and at the same time generate a photosensitizer (PS) compound, for example from a photosensitizer precursor/generator added to the PSCAR resist. Both the acid and photosensitizer (PS) are generated only in illuminated portions of the PSCAR resist, during the first EUV patterned exposure. Thereafter, a second exposure is performed. This second exposure is a flood exposure, i.e. with no pattern, at a second wavelength of EMR different than the wavelength of the first EUV exposure. The PSCAR resist chemistry is chosen such that the photosensitizer (PS) is sensitive to the second wavelength of EMR used in the flood exposure, while other resist components are not. The photosensitizer (PS), wherever present in the pattern formed during the first EUV patterned exposure, causes further generation of acid during the flood exposure. Tenfold increases of acid concentration, for example, may be typical. This photosensitizer-induced acid concentration increase results in greatly increased contrast, which allows more process latitude particularly with respect to the resolution line width roughness sensitivity (RLS) tradeoff. Thus, PSCAR presents an enabling technology for EUV lithography because it allows the productive use of EUV sources and lithography at their present power levels.

It should be noted here that PSCAR processes may involve additional steps, for example between the first EUV patterned exposure and the flood exposure as the above description was simplified for purposes of clarity. Also, in some PSCAR chemistry embodiments, no acid may be generated during the first EUV patterned exposure, and only photosensitizer (PS) may be generated, which generated photosensitizer (PS) causes generation of all acid during the flood exposure. Alternatively yet, acid may be generated in small quantities, as explained before, but it may be effectively consumed by competing chemical reactions, such as quenching events (depending on the amount of quencher present in the PSCAR resist).

Because the power levels of EUV sources are so low, and because EUV photons each have a relatively high energy due to the short EUV EMR wavelength, there are relatively fewer photons involved in the patterned EUV exposure (for the same exposure dose) than when longer wavelength EMR sources are used (e.g. argon fluoride (ArF), krypton fluoride (KrF), etc.) This means that there will be fewer acid molecules generated, for example, in a traditional chemically-amplified resist (CAR). As the EUV exposure dose is decreased, the stochastic probability increases of a photoacid generator (PAG) molecule not being decomposed into acid within a given volume, leading to uneven acid concentration within the resist—an effect collectively known as shot noise. Shot noise is known to be one of the major causes of line width roughness (LWR) in patterning. Depending on the feature type, other parameters such as line edge roughness (LER) or contact edge roughness (CER) may also be affected, where applicable.

One known PSCAR technique includes a step of diffusing the photosensitizer molecules to reduce the nonuniformity due to EUV shot noise. An example of such techniques is disclosed U.S. Pat. No. 9,746,774 entitled "Mitigation of EUV Shot Noise Replicating into Acid Shot Noise in Photo-Sensitized Chemically-Amplified Resist (PS-CAR)" by Carcasi and Somervell, the disclosure of which is expressly incorporate herein by reference in its entirety. Other known lithography techniques are known to be used to improve critical dimension control through the use of PSCAR processes. Examples of use of other PSCAR techniques are disclosed in U.S. Pat. No. 10,096,528 entitled "Critical Dimensions Control by Use of a Photo Agent" by deVilliers and Carcasi and U.S. Published Patent Application No. 2017/0329229 entitled "Critical Dimension Control by Use of Photo-Sensitized Chemicals or Photo-Sensitized Chemically Amplified Resist" by Carcasi and deVilliers, the disclosures of both being expressly incorporated herein by reference in their entireties. The critical dimension control techniques of U.S. Pat. No. 10,096,528 and U.S. Published Patent Application No. 2017/0329229 include of a first develop process prior to the flood exposure followed by a second develop process.

In addition to the PSCAR techniques described above, additional techniques for acid generation through a two-step illumination process are known. For example, published PCT Patent Application WO2018/074382 describes an alternative process using both EUV energy rays and second energy rays such as UV. As described in that patent application, a photoacid generator (PAG) is a color changing PAG. The color changing PAG changes color with a similar reaction as in the PSCAR techniques, however the color changing PAG decomposes with UV flood exposure to generate additional acid. More specifically, the color changing PAG does not utilize photosensitization reactions (electron transfer or energy transfer) but rather the color changing PAG directly absorbs photons and decomposes. The color changing PAG may be an onium salt type weak acid (or water) generator. In such a process, the color change PAG does not utilize photosensitization reactions (electron transfer or energy transfer) but rather the process involves the direct absorption of photons and decomposition.

Thus, as described above, in the prior art there are known EMR absorbing processes. For example, some EMR absorbing processes may utilize a photosensitization reaction (electron transfer or energy transfer) such as the PSCAR processes described above. Other EMR absorbing processes may use directly absorb photons and decomposition such as the direct decomposition by color change (absorption shift) of PCT Patent Application WO2018/074382.

It would be desirable to provide an improved patterning technique utilizing EMR absorbing processes.

SUMMARY

It has been found that due to photon shot noise and chemical noise, there exists a stochastic driven problem of missing contact holes during lithography processing of substrates. Similarly it has been found that there is a problem of scummed contact holes and scum bridging of pattern lines at the bottom of regions in which resist is to be removed, the problem resulting from a combination of absorption effects, interaction effects and stochastic effects. Described herein are innovative methods for alleviating such missing contact holes, scummed contact holes and scum bridging of pattern line defects. Specifically EMR absorbing processes are utilized having multiple exposures of different energy levels. For example, some EMR absorbing processes may utilize a photosensitization reaction (electron transfer or energy transfer) such as the PSCAR processes described above. Other EMR absorbing processes may use directly absorbed photons and decomposition such as the direct decomposition by color change (absorption shift). The techniques described herein may use either technique and may further extend to other EMR absorbing processes in which two step application of different energy levels is applied (for example, but not limited to, an EUV energy level and a UV energy level). As described herein in one exemplary embodiment, EMR absorbing molecules and precursors of EMR absorbing molecules are provided. One particular example described below utilizes a PSCAR resist process having photosensitizer molecules and photosensitizer precursors as exemplary embodiments of the EMR absorbing molecules and precursors of EMR absorbing molecules. It will be recognized, however, the description of photosensitizer molecules and photosensitizer precursors is merely exemplary and other EMR absorbing molecules are possible.

In one embodiment, a PSCAR resist process is utilized in which an initial exposure and develop process is performed followed by a flood exposure. Thus, for example, a contact hole pattern may by exposed on a substrate using a first wavelength of EMR. In one embodiment, the first wavelength of EMR may be an EUV wavelength. Then a resist develop process may be performed. Next a flood exposure of a second wavelength of EMR may be performed with a wavelength of EMR that is different from the first wavelength of EMR. In one embodiment, the second wavelength is greater than the first wavelength of EMR. For example, the first wavelength may be an EUV wavelength and the second wavelength may be an ultraviolet (UV) wavelength. Then, a second develop process may be utilized. Use of the flood exposure of the second wavelength of EMR enables contact holes that did not properly form after the first develop to be formed after the second develop. In the PSCAR resist process utilized, the resist may be a radiation sensitive material having at least (1) a first EMR wavelength activation threshold that controls the generation of acid to a first acid concentration in the radiation sensitive material and controls generation of photosensitizer molecules in the radiation sensitive material, and (2) a second EMR wavelength activation threshold that can excite the photosensitizer molecules in the radiation sensitive material that results in the acid comprising a second acid concentration that is greater than the first acid concentration, the second EMR wavelength activation threshold being higher than the first EMR wavelength activation threshold. In this process, the photosensitizer is generated from photosensitizer precursors in the resist. Most of the photosensitizer that was generated in opened contact holes will be solvated/washed away during the first develop process. However, the photosensitizer in the missing/closed contact holes will remain and can be used to amplify the acid generation in the missing/closed contact holes by use of the flood exposure. Then the second develop process may open up the previously closed contact holes. As to the contact holes that were opened in the first develop process, because most of the photosensitizer in these holes has been solvated/washed away from the first develop process, the missing contact holes can be opened in the second develop process without greatly affecting critical dimensions and profiles of the already opened contact holes.

In a second embodiment, a photolithography process is utilized in which photosensitizer precursors are incorporated into a layer underlying the resist layer. In this process, enhanced formation of photosensitizer will result at the interface of the resist layer and the underlying layer. The enhanced formation of photosensitizer at the interface is particularly beneficial for addressing scumming at the base of contacts or scumming that bridges pattern lines. In the second embodiment, the use of photosensitizer precursors in the underlying layer provides for enhanced formation of photosensitizer at the resist/underlying layer interface. The flood exposure will generate more acids in areas of scumming and then the second develop step may be used to remove the resist in these areas, thus minimizing missing or scummed contacts or bridging of lines. Thus as disclosed herein, a process may be utilized having an underlying layer that has embedded photosensitive precursors. In one embodiment the underlying layer is a bottom antireflective coating (BARC) layer. In one specific embodiment, the underlying layer is a silicon antireflective coating (SiARC) layer. The use of photosensitizer precursors incorporated in a layer underlying the resist layer may be utilized in a single develop photolithography process flow. Alternatively, the use of photosensitizer precursors incorporated in a layer underlying the resist layer may be utilized in a multiple develop photolithography process. Further, the use of embedded photosensitizer precursors may be utilized independent of the inclusion of a PSCAR resist process. Alternatively, the embedded photosensitizer precursors may be utilized in conjunction with a PSCAR resist process. For example, a multiple exposure photolithography process may be an enhanced PSCAR process using a PSCAR resist with an initial patterned exposure and then following with a flood exposure. In one example, a contact hole pattern may by exposed on a substrate using a first wavelength of EMR. In one embodiment, the first wavelength of EMR may be an EUV wavelength. Next a flood exposure of a second wavelength of EMR may be performed with a wavelength of EMR that is different from the first wavelength of EMR. In one embodiment, the second wavelength is greater than the first wavelength of EMR. For example, the first wavelength may be an EUV wavelength and the second wavelength may be a UV wavelength. Use of the flood exposure of the second wavelength of EMR enables contact holes that otherwise would not properly form to be formed without scumming. In one embodiment, one develop process is utilized, for example after the flood exposure. In another embodiment, two develop processes may be utilized, a first develop step between the first exposure and the flood exposure and then a second develop step after the flood exposure. In the two develop process flow, some contact holes may have resist scumming at the base of the contact after the first develop step and the flood exposure and second develop step may remove this scumming. If a PSCAR resist process is utilized, the resist may be a radiation sensitive material having at least (1) a first EMR wavelength activation threshold that controls the generation of acid to a first acid concentration in the radiation sensitive material and controls generation of photosensitizer molecules in the radiation sensitive material, and (2) a second EMR wavelength activation threshold that can excite the photosensitizer molecules in the radiation sensitive material that results in the acid comprising a second acid concentration that is greater than the first acid concentration, the second EMR wavelength activation threshold being higher than the first EMR wavelength activation threshold.

In one embodiment, a method for forming contact holes in a radiation sensitive material on a substrate is described. The method may comprise providing an underlying layer on the substrate and providing the radiation sensitive material above the underlying layer. The radiation sensitive material may have at least (1) a first EMR wavelength activation threshold that controls the generation of acids to a first acid concentration in the radiation sensitive material and controls generation of EMR absorbing molecules in the radiation sensitive material, and (2) a second EMR wavelength activation threshold that can excite the EMR absorbing molecules in the radiation sensitive material that results in the acids comprising a second acid concentration that is greater than the first acid concentration, the second EMR wavelength activation threshold being higher than the first EMR wavelength activation threshold. The method further comprises exposing a first wavelength of EMR through a patterned mask onto the radiation sensitive material to generate the EMR absorbing molecules within the radiation sensitive material, the first wavelength of EMR comprising a wavelength that is at or above the first EMR wavelength activation threshold and lower than the second EMR wavelength activation threshold. The method also comprises performing a first develop process of the radiation sensitive material so as to form a plurality of contact holes in the radiation sensitive material corresponding at least in part to the patterned mask, at least a portion of a pattern of the pattern mask being incompletely formed after the first develop process such that incomplete contact hole regions exist in the radiation sensitive material. The method further comprises flood exposing a second wavelength of EMR to the radiation sensitive material after performing the first develop process, the second wavelength of EMR being at or above the second EMR wavelength activation threshold. The method also comprises performing a second develop process of the radiation sensitive material, the second develop process converting the incomplete contact hole regions to contact holes.

The method described above may further comprise utilizing a gap-fill coating formed after the first develop process and before the flood exposing to at least partially fill gaps formed on the substrate from the first develop process. In one embodiment of the method, the radiation sensitive material may comprise precursors of EMR absorbing molecules comprising acetophenone, triphenylene, benzophenone, fluorenone, anthraquinone, phenanthrene, or derivatives and combinations thereof. In some embodiments of the method, prior to the flood exposing, the radiation sensitive material has the EMR absorbing molecules, wherein an EMR absorbing molecule concentration profile varies from the top to the bottom of the radiation sensitive material. In one embodiment, an EMR absorbing molecule concentration is higher at a top of the radiation sensitive material than at the bottom of the radiation sensitive material. In some embodiments, precursors of EMR absorbing molecules are configured to generate the EMR absorbing molecule concentration profile. In other embodiments, a topcoat is utilized to generate the EMR absorbing molecule concentration profile via chemical affinities.

In another embodiment, a method for forming a pattern in a radiation sensitive material on a substrate is described. The method may comprise providing the radiation sensitive material and providing an underlying layer on the substrate, the underlying layer underlying the radiation sensitive material, the underlying layer having precursors of EMR absorbing molecules. The method may further comprise exposing a first wavelength of EMR through a patterned mask onto the radiation sensitive material to generate EMR absorbing molecules, the EMR absorbing molecules formed from the precursors of EMR absorbing molecules in the underlying layer. The method further comprises flood exposing a second wavelength of EMR onto the radiation sensitive material, the flood exposing converting at least some of the EMR absorbing molecules to acids. According to the method, the EMR absorbing molecules formed from the precursors of EMR absorbing in the underlying layer assist in the generation of the pattern of the pattern mask in the radiation sensitive material by creating an enhanced acid level in the radiation sensitive material.

In one embodiment of the method described above, the pattern is a contact hole pattern. In another embodiment of the method described above, the radiation sensitive material also has precursors of EMR absorbing molecules. In one embodiment, the precursors of EMR absorbing molecules embedded in the underlying layer and the precursors of EMR absorbing molecules in the radiation sensitive material have the same composition. In an alternative embodiment, the precursors of EMR absorbing molecules embedded in the underlying layer and the precursors of EMR absorbing molecules in the radiation sensitive material have different compositions. In some embodiments, the methods further comprise performing a first develop process after exposing the first wavelength of EMR through the patterned mask but before the flood exposing and performing a second develop process after the flood exposing. Some embodiments further comprise utilizing a gap-fill coating formed after the first develop process and before the flood exposing to at least partially fill gaps formed on the substrate from the first develop process. In another embodiment, the EMR absorbing molecules are photosensitizer molecules and the precursors of EMR absorbing molecules are photosensitizer precursors.

In yet another embodiment, a method for forming a contact hole pattern in a radiation sensitive material on a substrate is described. The method may comprise providing the radiation sensitive material, the radiation sensitive material having at least (1) a first EMR wavelength activation threshold that controls the generation of acids to a first acid concentration in the radiation sensitive material and controls generation of first EMR absorbing molecules in the radiation sensitive material, and (2) a second EMR wavelength activation threshold that can excite the first EMR absorbing molecules in the radiation sensitive material that results in the acids comprising a second acid concentration that is greater than the first acid concentration, the second EMR wavelength activation threshold being higher than the first EMR wavelength activation threshold. The method further comprises providing an underlying layer on the substrate, the underlying layer underlying the radiation sensitive material, the underlying layer having precursors of EMR absorbing molecules. The method also comprises exposing a first wavelength of EMR through a patterned mask having the contact hole pattern onto the radiation sensitive material to generate the first EMR absorbing molecules within the radiation sensitive material and to generate second EMR absorbing molecules, the second EMR absorbing molecules formed from the precursors of EMR absorbing molecules in the underlying layer, the first wavelength of EMR comprising a wavelength that is at or above the first EMR wavelength activation threshold and lower than the second EMR wavelength activation threshold. The method further comprises performing a first develop process of the radiation sensitive material so as to form a first pattern in the radiation sensitive material corresponding at least in part to the contact hole pattern of the patterned mask, at least some of the contact hole pattern of the patterned mask being incompletely formed after the first develop process. The method then comprise flood exposing a second wavelength of EMR to the radiation sensitive material after performing the first develop process, the second wavelength of EMR being at or above the second EMR wavelength activation threshold. The method also comprises performing a second develop process of the radiation sensitive material, the second develop process completing the formation of the contact hole pattern of the patterned mask in the radiation sensitive material. According to this method, the second EMR absorbing molecules formed from the precursors of EMR absorbing molecules in the underlying layer assist in the formation of the contact hole pattern of the patterned mask in the radiation sensitive material. In one alternative embodiment, the first EMR absorbing molecules and the second EMR absorbing molecules have the same composition. Another alternative embodiment comprises utilizing a gap-fill coating formed after the first develop process and before the flood exposing to at least partially fill gaps formed on the substrate from the first develop process. In another embodiment of the method, the first EMR absorbing molecules are first photosensitizer molecules, the second EMR absorbing molecules are second photosensitizer molecules, and the precursors of EMR absorbing molecules are photosensitizer precursors.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 1:
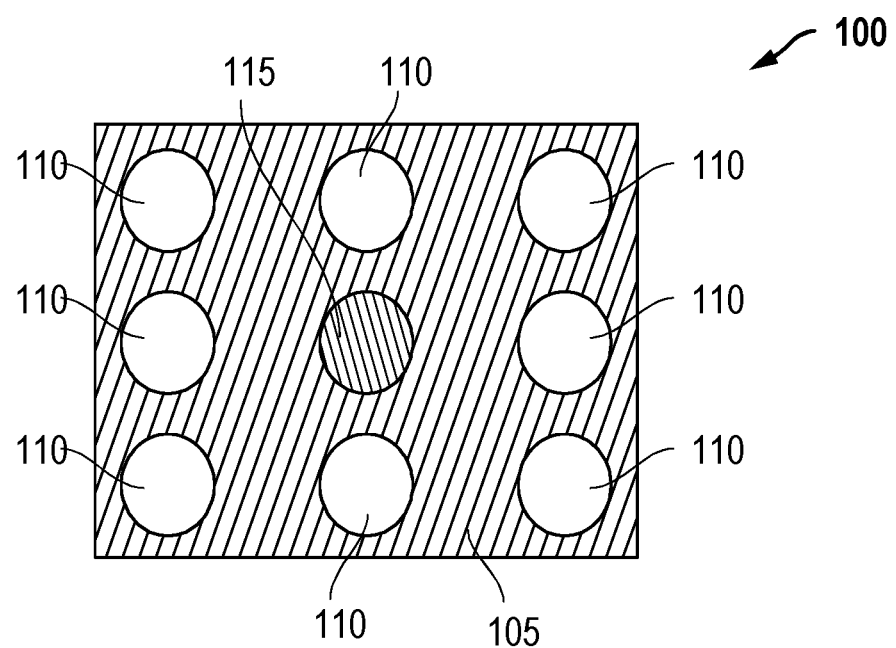
FIG. 1 illustrates a top view of a contact hole pattern having a missing contact hole.

Described herein are innovative methods to prevent missing contact holes, scummed contact holes or bridging when patterning substrates. Specifically EMR absorbing processes are utilized having multiple exposures of different energy levels. For example, some EMR absorbing processes may utilize a photosensitization reaction (electron transfer or energy transfer) such as the PSCAR processes described above. Other EMR absorbing processes may use directly absorbed photons and decomposition such as the direct decomposition by color change (absorption shift). The techniques described herein may use either technique and may further extend to other EMR absorbing processes in which two step application of different energy levels is applied (for example, but not limited to, an EUV energy level and a UV energy level). As described herein in one exemplary embodiment, EMR absorbing molecules and precursors of EMR absorbing molecules are provided. One particular example described below utilizes a PSCAR resist process having photosensitizer molecules and photosensitizer precursors as exemplary embodiments of the EMR absorbing molecules and precursors of EMR absorbing molecules. It will be recognized, however, the description of photosensitizer molecules and photosensitizer precursors is merely exemplary and other EMR absorbing molecules are possible. Further, it will be recognized that the though certain embodiments are described herein for EMR having EUV and UV wavelengths, it will be recognized that as used herein EMR encompasses radiation of a wide variety of spectrums including, for example, the UV spectrums (VUV, EUV, UV, etc.), visible spectrums, and infrared spectrums. Further, EMR is not limited to only those spectrums and may include other wavelengths of EMR energy. Thus, as utilized herein, EMR may include a wide variety of wavelengths and is not limited to only those wavelengths or spectrums utilized in the exemplary embodiments described herein.

In one embodiment, a PSCAR resist process is utilized in which an initial exposure and develop process is performed followed by a flood exposure. Thus, for example, a contact hole pattern may by exposed on a substrate using a first wavelength of EMR. In one embodiment, the first wavelength of EMR may be an EUV wavelength. Then a resist develop process may be performed. Next a flood exposure of a second wavelength of EMR may be performed with a wavelength of EMR that is different from the first wavelength of EMR. In one embodiment, the second wavelength is greater than the first wavelength of EMR. For example, the first wavelength may be an EUV wavelength and the second wavelength may be a UV wavelength. Then, a second develop process may be utilized. Use of the flood exposure of the second wavelength of EMR enables contact holes that did not properly form after the first develop to be formed after the second develop. In the PSCAR resist process utilized, the resist may be a radiation sensitive material having at least (1) a first EMR wavelength activation threshold that controls the generation of acid to a first acid concentration in the radiation sensitive material and controls generation of photosensitizer molecules in the radiation sensitive material, and (2) a second EMR wavelength activation threshold that can excite the photosensitizer molecules in the radiation sensitive material that results in the acid comprising a second acid concentration that is greater than the first acid concentration, the second EMR wavelength activation threshold being higher than the first EMR wavelength activation threshold. In this process, the photosensitizer is generated from photosensitizer precursors in the resist. Most of the photosensitizer that was generated in opened contact holes will be solvated/washed away during the first develop process. However, the photosensitizer in the missing/closed contact holes will remain and can be used to amplify the acid generation in the missing/closed contact holes by use of the flood exposure. Then the second develop process may open up the previously closed contact holes. As to the contact holes that were opened in the first develop process, because most of the photosensitizer in these holes has been solvated/washed away from the first develop process, the missing contact holes can be opened in the second develop process without greatly affecting critical dimensions and profiles of the already opened contact holes.

In a second embodiment, a photolithography process is utilized in which photosensitizer precursors are incorporated into a layer underlying the resist layer. In this process, enhanced formation of photosensitizer will result at the interface of the resist layer and the underlying layer. The enhanced formation of photosensitizer at the interface is particularly beneficial for addressing scumming at the base of contacts or scumming that bridges pattern lines. In the second embodiment, the use of photosensitizer precursors in the underlying layer provides for enhanced formation of photosensitizer at the resist/underlying layer interface. The flood exposure will generate more acids in areas of scumming and then the second develop step may be used to remove the resist in these areas, thus minimizing missing or scummed contacts or bridging of lines. Thus as disclosed herein, a process may be utilized having an underlying layer that has embedded photosensitive precursors. In one embodiment the underlying layer is a bottom antireflective coating (BARC) layer. In one specific embodiment, the underlying layer is a silicon antireflective coating (SiARC) layer. The use of photosensitizer precursors incorporated in a layer underlying the resist layer may be utilized in a single develop photolithography process flow. Alternatively, the use of photosensitizer precursors incorporated in a layer underlying the resist layer may be utilized in a multiple develop photolithography process. Further, the use of embedded photosensitizer precursors may be utilized independent of the inclusion of a PSCAR resist process. Alternatively, the embedded photosensitizer precursors may be utilized in conjunction with a PSCAR resist process. For example, a multiple exposure photolithography process may be an enhanced PSCAR process using a PSCAR resist with an initial patterned exposure and then following with a flood exposure. In one example, a contact hole pattern may by exposed on a substrate using a first wavelength of EMR. In one embodiment, the first wavelength of EMR may be an EUV wavelength. Next a flood exposure of a second wavelength of EMR may be performed with a wavelength of EMR that is different from the first wavelength of EMR. In one embodiment, the second wavelength is greater than the first wavelength of EMR. For example, the first wavelength may be an EUV wavelength and the second wavelength may be a UV wavelength. Use of the flood exposure of the second wavelength of EMR enables contact holes that otherwise would not properly form to be formed without scumming. In one embodiment, one develop process is utilized, for example after the flood exposure. In another embodiment, two develop processes may be utilized, a first develop step between the first exposure and the flood exposure and then a second develop step after the flood exposure. In the two develop process flow, some contact holes may have resist scumming at the base of the contact after the first develop step and the flood exposure and second develop step may remove this scumming. If a PSCAR resist process is utilized, the resist may be a radiation sensitive material having at least (1) a first EMR wavelength activation threshold that controls the generation of acid to a first acid concentration in the radiation sensitive material and controls generation of photosensitizer molecules in the radiation sensitive material, and (2) a second EMR wavelength activation threshold that can excite the photosensitizer molecules in the radiation sensitive material that results in the acid comprising a second acid concentration that is greater than the first acid concentration, the second EMR wavelength activation threshold being higher than the first EMR wavelength activation threshold.

It will be recognized that the first embodiment and the second embodiment described above may be used separately. Alternatively, both the first embodiment and the second embodiment may be utilized in combination.

As described above, the photo resist of the PSCAR process may have at least two wavelength activation thresholds. A first wavelength activation threshold may form acids in the photo resist and also convert photosensitive precursors to photosensitizer molecules. In one embodiment, the first wavelength activation threshold is set to be responsive to EUV or lower wavelengths of EMR. Typically the wavelengths of EMR that control the first wavelength activation threshold are provided during a patterned exposure of EMR. A second wavelength activation threshold controls the excitation of the photosensitive molecules that results in the formation of additional acids in the resist. In one embodiment, the second wavelength activation threshold is set to be higher than the first wavelength activation threshold, for example UV or higher wavelengths of EMR. Typically the wavelengths of EMR that control the second wavelength activation threshold are provided during an unpatterned flood exposure of EMR.

Figure 2:
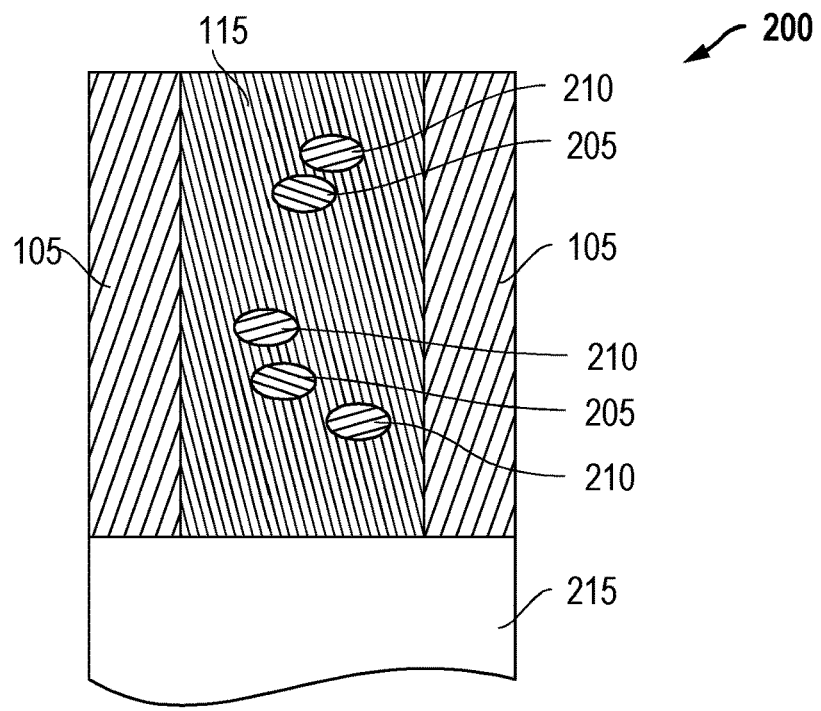
FIG. 2 illustrates a cross-section of the missing contact hole of FIG. 1.
Figure 3:
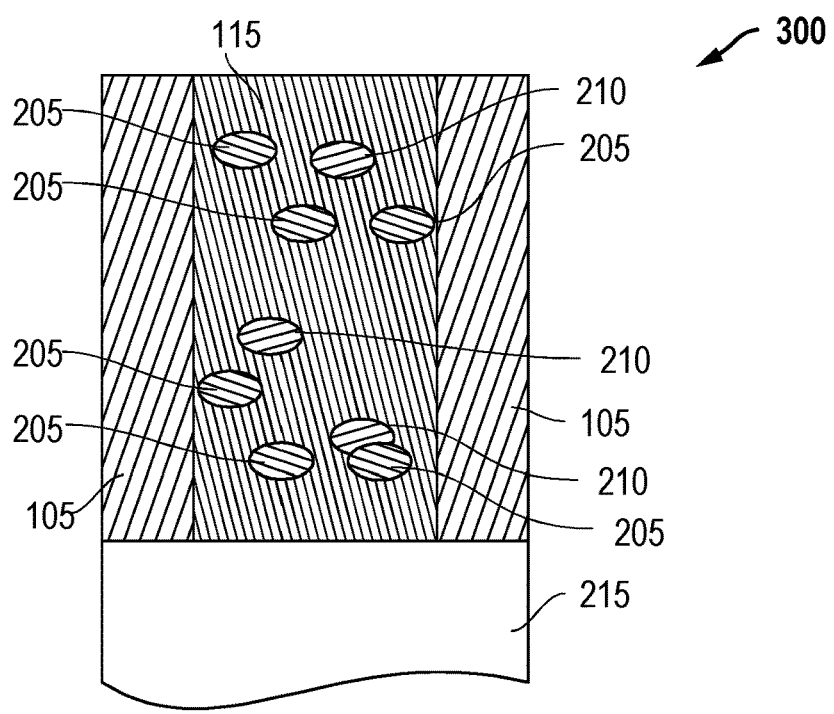
FIG. 3 illustrates the cross-section FIG. 2 after flood exposure.
Figure 4:
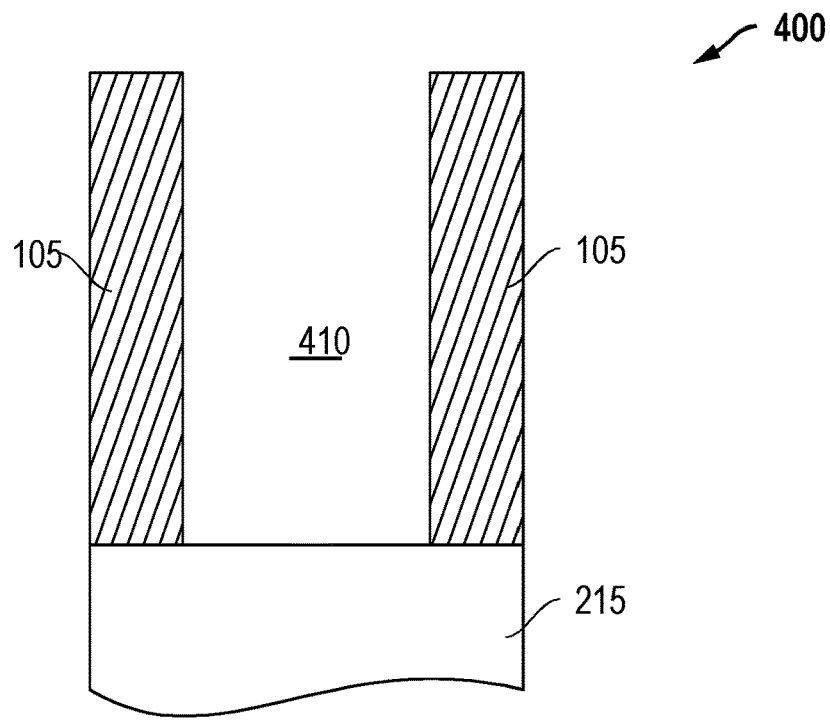
FIG. 4 illustrates the cross-section of FIG. 3 after the second develop process.
Figure 5:
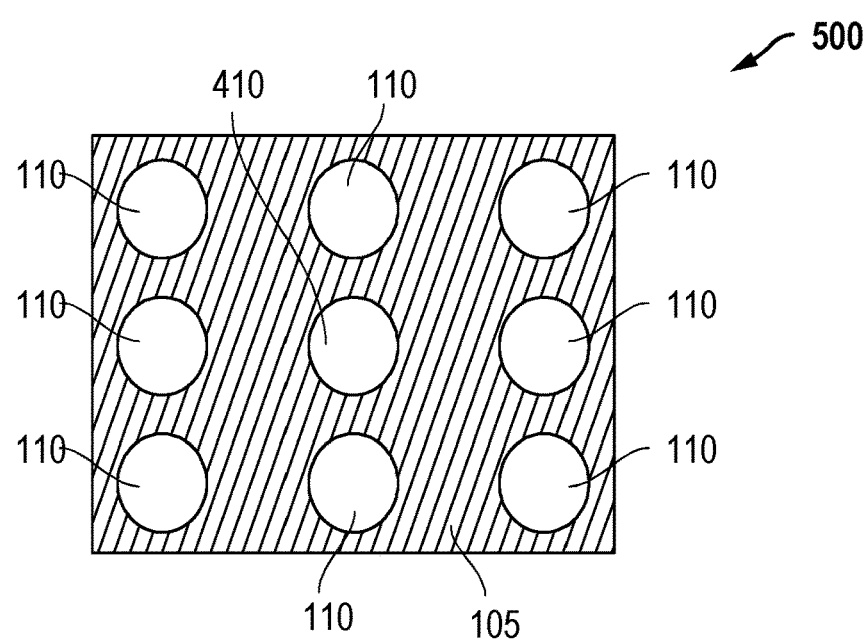
FIG. 5 illustrates a top view of the contact hole pattern of FIG. 1 after the second develop process.

FIG. 1 illustrates a patterned layer 100 top view having missing contact holes, for example after a first develop process. More particularly, resist 105 has contact holes 110 and a missing contact hole 115. FIG. 2 illustrates a missing contact hole cross-section 200 of the missing contact hole 115 above a substrate 215. The cross-section of FIG. 2 is shown after an initial exposure and first develop step as described above. As shown in the figure, within the missing contact hole 115 acids 205 and photosensitizer 210 may be present. Next processing continues with a flood exposure. FIG. 3 illustrates a post flood exposure cross-section 300 of the missing contact hole 115. As shown in FIG. 3, post flood exposure, increased formation of acids occurs as compared to that as shown in FIG. 2 (FIG. 2 being before the flood exposure process). Then a second develop process may be performed. FIG. 4 illustrates a cross-section of the previously missing contact hole 115 after the second develop process. As shown in the post second develop cross-section 400 of FIG. 4, a contact hole 410 is now created in the place of the previously missing contact hole 115. A post second develop top view 500 illustrates a top view of the resist 105 and the contact holes 110 originally formed (formed from the first develop process) and the contact hole 410 formed from the second develop process.

Thus, as described herein, a process in which a flood exposure is utilized after a first develop step is provided to open up contact holes that are missing after the initial EUV exposure and development steps. In this embodiment, the photosensitizer generated from photosensitizer precursors in proximity to acids that were generated by the EUV exposure are created in the missing contact holes in the initial patterned EUV exposure. The generated photosensitizers can then be used to amplify the acid generation and deprotection in the closed contact hole to open it up after a flood exposure and develop steps. Given that most of the photosensitizers that were generated in the other contacts holes (those fully formed from the first exposure and development steps) has been solvated/washed away during the first development step, this process allows opening up missing contact holes without greatly affecting the already opened contact hole critical dimensions and profiles.

As described above, a process flow of a first patterned exposure, a first develop step, an unpatterned flood exposure and a second develop step is provided. It will be recognized that this description is not meant to be exclusive of the inclusion of other well-known photolithography steps within the process flow. For example, the use of post-exposure bake (PEB) processes which bake the photo resist after exposure is preformed but before develop may be utilized. For example, a post-exposure bake may be performed after the first patterned exposure and/or after the second unpatterned flood exposure. In addition, after development inspection (ADI) steps may be performed after one or both development steps. Other additional known photolithography steps may also be performed as the description provided herein is not meant to be limiting to exclude the inclusion of such steps.

Due to potential evanescent effects, it may be desirable that the resist material be transparent to the flood wavelength (while the photosensitizer material is absorbing of it) to facilitate EMR propagating to the bottom of the narrow spaces or holes formed. Optionally, after the first develop step a coating utilized to fill gaps in the patterned formed in the resist may be utilized before the flood exposure step. The gap-fill coating may be advantageous due to propagation issues that may arise related to the flood exposure. More specifically as linewidths decrease very thin apertures are created within the resist. Due to the higher wavelengths of the flood exposure, the flood exposure EMR may not fully propagate through these thin apertures. Such propagation effects may be particularly important at the lower portions of the photo resist. In order to address the effects of thin apertures, the gap-fill coating may be provided over the resist prior to the flood exposure so as to fill spaces (the gaps) formed after the first develop step. A wide range of materials may be utilized as the gap-fill coating. In some embodiments, the gap-fill material may comprise at least one polymer compound from the group consisting of poly (vinyl alcohol), poly(acrylamide), poly(phthalaldehyde), poly(succinaldehyde), poly(allyl alcohol), poly(glyoxylic acid), poly (methyl glyoxylic acid), poly(ethyl glyoxylic acid), poly (methyl glyoxylate), poly(ethyl glyoxylate), and poly (aspartic acid). Furthermore, the gap-fill treatment liquid can comprise at least one polymer salt of the poly (methyl glyoxylic acid) and/or poly(ethyl glyoxylic acid). Such as ammonium and sodium polymer salts thereof. Such examples are described in more detail in U.S. Pat. No. 9,454,081 entitled "Line Pattern Collapse Mitigation Through Gap-Fill Material Application" by Somervell, et al., the disclosure of which is expressly incorporated herein in its entirety. In yet another embodiment, a polymeric dielectric material such as hydrogen silsesquioxane (HSQ) may be utilized as the gap-fill coating.

The photo resist utilized for the above described process may be any of a wide variety of PSCAR resists. In one embodiment, the photo resist may comprise a photosensitizer generation compound comprising acetophenone, triphenylene, benzophenone, fluorenone, anthraquinone, phenanthrene, or derivatives and combinations thereof. Further the photo resist may comprise a photoacid generation compound comprising at least one of triphenylsulfonium triflate, triphenylsulfonium nonaflate, triphenylsulfonium perfluorooctylsulfonate, triarylsulfonium triflate, triarylsulfonium nonaflate, triarylsulfonium perfluorooctylsulfonate, a triphenylsulfonium salt, a triarylsulfonium salt, a triarylsulfonium hexafluoroantimonate salt, N-hydroxynaphthalimide triflate, 1,1-bis[p-chlorophenyl]-2,2,2-trichloroethane(DDT), 1,1-bis[p-methoxyphenyl]-2,2,2-trichloroethane, 1,2,5,6,9,10-hexabromocyclododecane, 1,10-dibromodecane, 1,1-bis[p-chlorophenyl]2,2-dichloroethane, 4,4-dichloro-2-(trichloromethyl)benzhydrol, 1,1-bis (chlorophenyl) 2-2,2-trichloroethanol, hexachlorodimethylsulfone, 2-chloro-6-(trichloromethyl)pyridine, or derivatives and combinations thereof. It will be recognized, however, that such examples are merely exemplary and other photo resists may be utilized.

Figure 6:
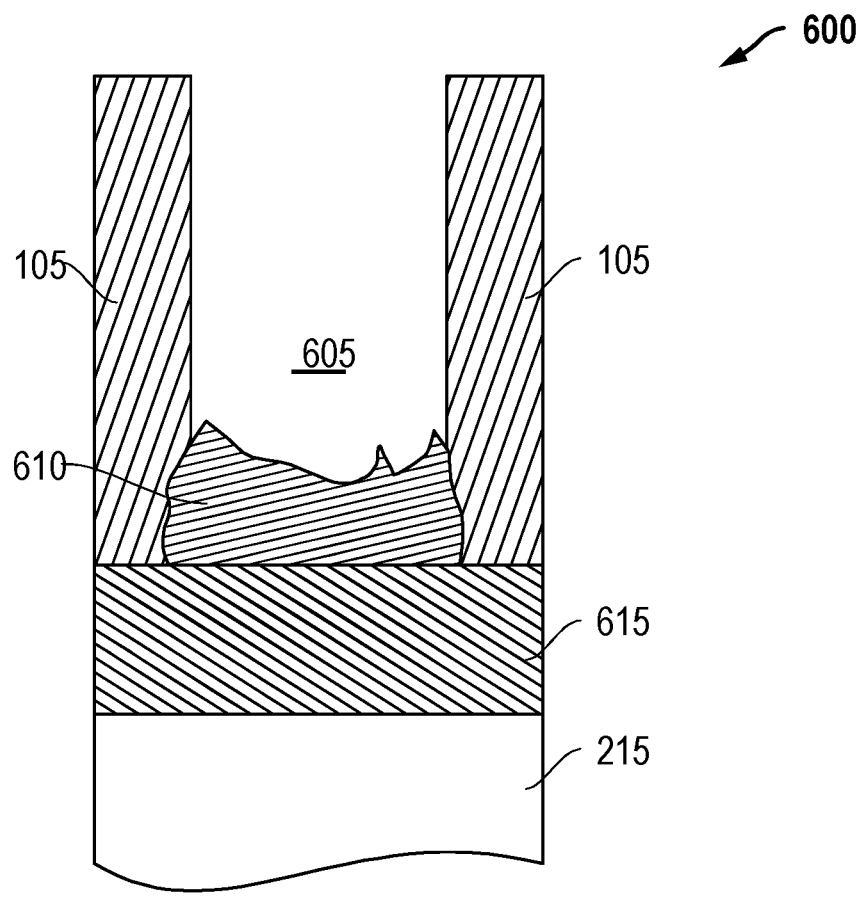
FIG. 6 illustrates a cross-section of a contact hole which has resist scumming.

FIG. 6 illustrates another lithography problem, resist scumming at the base of a pattern. In the example of FIG. 6, a cross-section 600 illustrates resist scumming. As shown in FIG. 6, a resist 105 is provided on an underlying layer 615 which is provided above a substrate 215. As shown in FIG. 6, a contact hole 605 is not fully developed, but rather has resist scumming 610 in the base of the contact hole 605. A second embodiment of the techniques describe herein provides an enhanced lithography process to address issues such as resist scumming 610. More particularly, photosensitizer precursors may be added to the underlying layer 615. In some embodiments, the underlying layer 615 may be a BARC layer and in specific embodiments, a SiARC layer. However, it will be recognized that the underlying layer 615 may be formed of any type of material in which photosensitizer precursors may be placed.

Figure 7A:
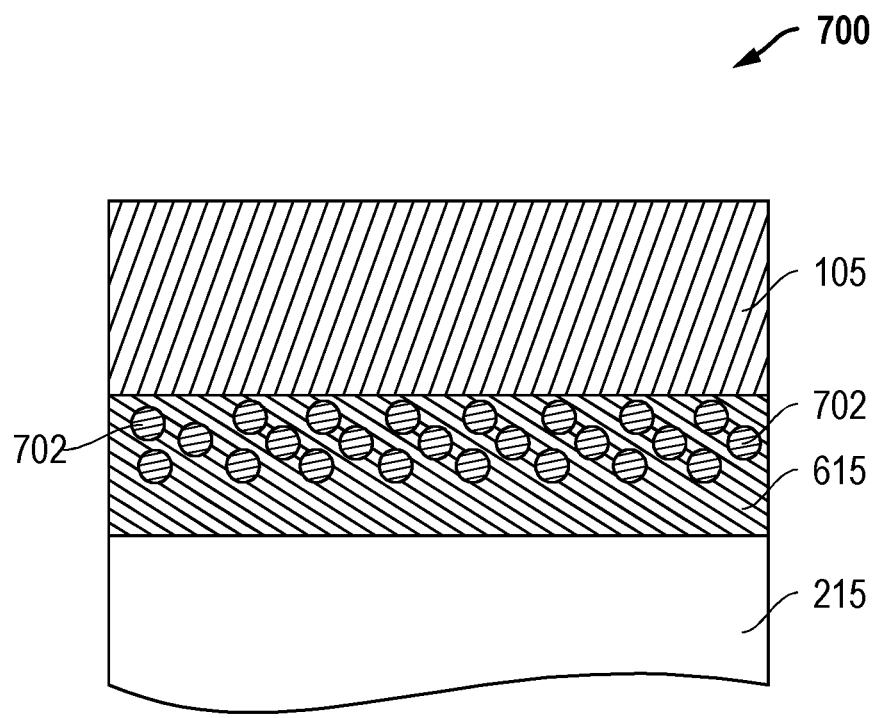
FIG. 7A illustrates a cross-section of a contact region before patterned exposure and having an underlying layer which is embedded with photosensitizer precursors.
Figure 7B:
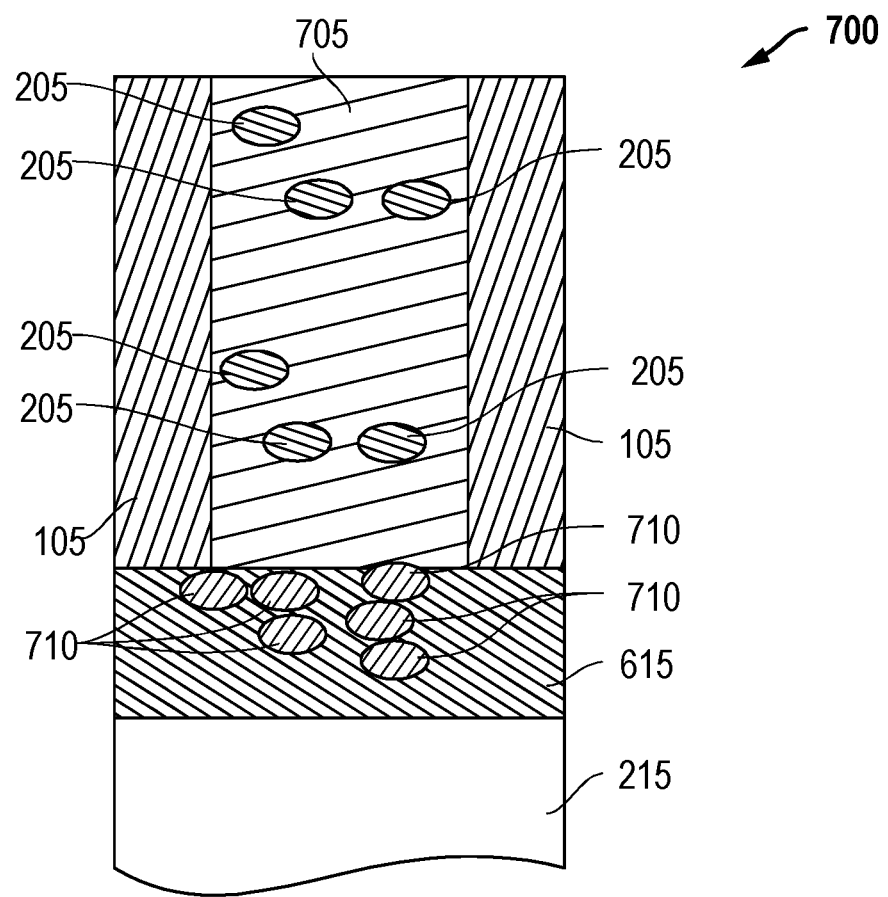
FIG. 7B illustrates a cross-section of the contact region of FIG. 7A after a patterned exposure.
Figure 7C:
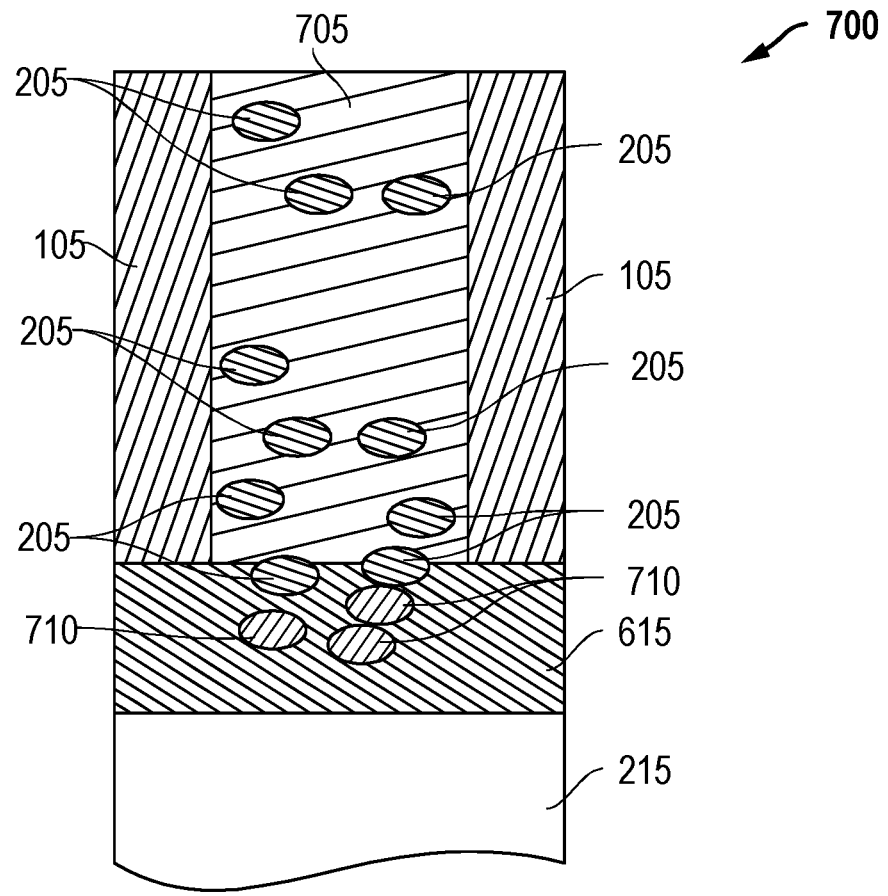
FIG. 7C illustrates a cross-section of the contact region of FIG. 7B after a flood exposure.
Figure 7D:
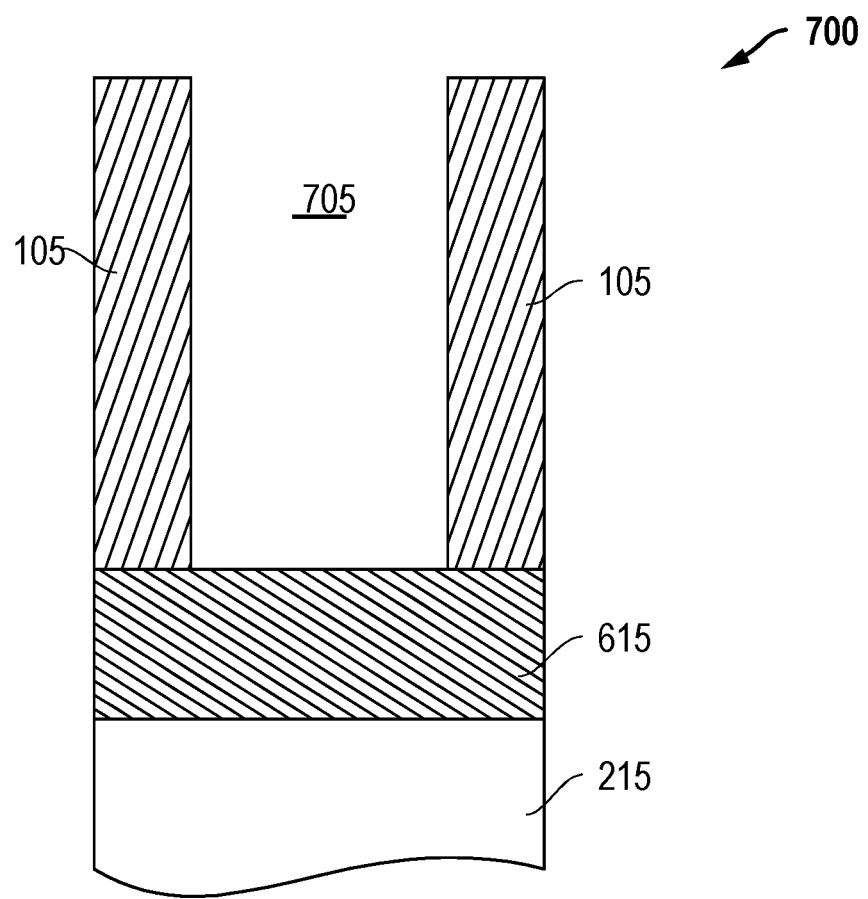
FIG. 7D illustrates a cross-section of the contact region of FIG. 7C after a develop process.

FIGS. 7A, 7B and 7C illustrate the impact of embedding a photosensitizer precursor in the underlying layer 615 underlying the resist 105. As shown in FIG. 7A, resist structure 700 has resist 105 and an underlying layer 615 above substrate 215. The underlying layer 615 is embedded with photosensitizer precursors 702 as shown. FIG. 7B illustrates the resist structure 700 after a patterned exposure, for example a patterned EUV exposure. As shown in FIG. 7B, acids 205 may be formed in the contact hole region 705 due to the EUV exposure. Further, as shown in FIG. 7B, the photosensitizer precursors 702 of FIG. 7A may be converted to photosensitizers 710 due to the EUV exposure below the contact hole region 705. Next, a flood exposure may be applied to the resist structure 700. The flood exposure may result in some or all of the photosensitizers 710 to convert to acids 205, thus providing a higher concentration of acids 205 as shown in FIG. 7C. Next a develop process may be utilized to remove resist from the contact hole region 705 as shown in FIG. 7D. The formation of a higher concentration of acids 205, particularly at the bottom of the contact hole region 705, that results from the photosensitizer precursors 702 embedded in the underlying layer 615 helps limit resist scumming at the bottom of patterned structures, such as where the underlying layer 615 interfaces with the resist 105. The precursors may be embedded in the underlying layer in a variety of manners. For example, the precursors may be in solution with the material that is spin coated on the substrate to form the underlying layer. Alternatively, the precursor may be chemically bonded to the underlying layer matrix. Other methods could also be utilized.

As shown in FIGS. 7A-7D, the photosensitizer precursors are embedded in the underlying layer 615 to generate photosensitizers at the interface of the underlying layer and the resist. Though not show, it will be recognized that the photosensitizers may also be present throughout the resist such as generated in the techniques described in the other embodiments above. Thus, the use of embedded photosensitizer precursors in the underlying layer to generate photosensitizers may also be utilized, in one preferred embodiment, with a PSCAR resist which includes photosensitizer generator or precursors as described above. The embedded photosensitizer precursors may, however, be utilized independent of a PSCAR resist that includes photosensitizer generators/precursors. In embodiments in which photosensitizer precursors are embedded in an underlying layer below a PSCAR resist, the photosensitizer molecules generated from the PSCAR resist and the photosensitizer molecules generated from the photosensitive precursors embedded in the underlying layer may be the same type of photosensitizer molecules. Alternatively, the photosensitizer molecules may be different types of molecules.

As described above in FIGS. 7A-7D, the use of photosensitizer precursors embedded in layers underlying a resist layer is described with regard to a process utilizing a single develop step. The use of photosensitizer precursors embedded in layers underlying a resist layer may also be utilized in a process which utilizes multiple develop steps (such as described above with regard to FIGS. 2-4). Thus in such an embodiment, a layer underlying a resist layer may be embedded with photosensitizer precursors. A patterned exposure process and a first develop step may then follow. Then, a flood exposure may be provided to increase the presence of acid in any scummed resist areas that may remain close to the interface with the underlying layer. A second develop step may then occur after the flood exposure step to complete the patterning. Thus, it will be recognized that the use of embedded photosensitizer precursors in a layer underlying a resist layer may advantageously be utilized with a process that utilizes one develop step or with a process that utilizes multiple develop steps.

Thus as described above, a photosensitizer precursor is introduced into the underlying material in contact with the resist (for example a SiARC underlayer). This process results in photosensitizers generated at the SiARC/resist interface which can be used then to create/amplify additional acids at the SiARC/resist interface with the goal of descumming/opening partially developed contact holes or microbridged lines. The photosensitizer precursor in the SiARC matrix may be converted to photosensitizers by scavenged secondary electrons (that were products of the EUV exposure) from the EUV exposure or by room temperature electron transfer reactions with acids in the resist at the SiARC/resist interface to preserve the EUV patterning location specific information. Similar to as described above with regard to other embodiments, the embodiment utilizing an underlying layer embedded with photosensitizer precursors may optionally include additional photolithography steps such as post-exposure bake, after develop inspect and the use of gap-fill coatings.

In still another embodiment, to open missing or partially open contact holes and to prevent scumming/bridging of lines, the photosensitizer concentration profile within the resist may be provided with a z-axis dependent concentration from the top of the resist to the bottom of the resist. More specifically, a z-axis dependent photosensitizer concentration is provided so as to increase the photosensitizer concentration in the upper regions of the photo resist. By providing such a photosensitizer profile, missing contacts may be minimized. In one example concentrations profiles may vary by providing 30-70% higher concentration of species in the top few nanometers of the resist film. Thus, the PSCAR acid amplification will vary by manipulating the photosensitizer concentration profile from the top of the resist to the bottom of the resist. Various techniques for forming the z-axis photosensitizer concentration may be utilized. In one embodiment, the photosensitive precursors may be modified to achieve the z-axis concentration change. In another embodiment, topcoat layers may be utilized to achieve the z-axis concentration change.

Thus, in one z-axis concentration dependency example, the photosensitizer precursor may be changed by tethering a fluoroalcohol-based additive on the photosensitizer precursor. By performing such tethering, a z-dependent segregation of the photosensitizer may be achieved. For example, the fluoroalcohols have a strong affinity for the air interface and will tend to drive material segregation affects. One exemplary process flow using a changed photosensitizer precursor would include a patterned exposure (for example an EUV exposure), then a post-exposure bake, then a first develop step, then a flood exposure (for example a UV exposure), then a second post-exposure bake, and finally a second develop step. As mentioned above, it will be recognized that not all of such steps are necessary and other steps may be added, all as will be recognized by those skilled in the art. For example, one or more of the post-exposure bakes may be utilized and a gap-fill coating layer may be added after the first develop step.

In another z-axis concentration dependency example, a topcoat layer may be placed on the top of resist, wherein the topcoat layer drives a surface affinity of the photosensitizer molecules. This provides a z-dependent segregation of the photosensitizer molecules to the top of the resist and thus helps open missing contact. For example, the topcoat material may be a material that includes a heavily flouroalcohol bonded polymer chain. The high polarity of such a topcoat material may drive segregation of resists species. One exemplary process flow using a topcoat layer may include a patterned exposure (for example an EUV exposure), then the formation of a topcoat layer, then a post-exposure bake, then a first develop step, then a flood exposure (for example a UV exposure), then a second post-exposure bake, and finally a second develop step. As mentioned above, it will be recognized that not all of such steps are necessary and other steps may be added, all as will be recognized by those skilled in the art. For example, one or more of the post-exposure bakes may be utilized and a gap-fill coating layer may be added after the first develop step. A second exemplary process flow using a topcoat layer may include a patterned exposure (for example an EUV exposure), then a post-exposure bake, then a first develop step, then the formation of a topcoat layer, then a flood exposure (for example a UV exposure), then a second post-exposure bake, and finally a second develop step. As mentioned above, it will be recognized that not all of such steps are necessary and other steps may be added, all as will be recognized by those skilled in the art. For example, one or more of the post-exposure bakes may be utilized and a gap-fill coating layer may be added after the first develop step.

It will be recognized that all of the layers shown and described herein may be part of a substrate that may be any substrate for which the use of patterned features is desirable. For example, in one embodiment, the substrate may be a semiconductor substrate having one or more semiconductor processing layers formed thereon. In one embodiment, the substrate may be a semiconductor wafer that has been subject to multiple semiconductor processing steps which yield a wide variety of structures and layers, all of which are known in the substrate processing art and may be considered to be part of the substrate. In one embodiment, the concepts disclosed herein may be particularly advantageous for use at a front end of line (FEOL) processing step. In other embodiments, the concepts disclosed herein may be utilized at a back end of line (BEOL) processing. Still further, the concepts disclosed herein may be used in a middle of line (MOL) process step.

Figure 8:
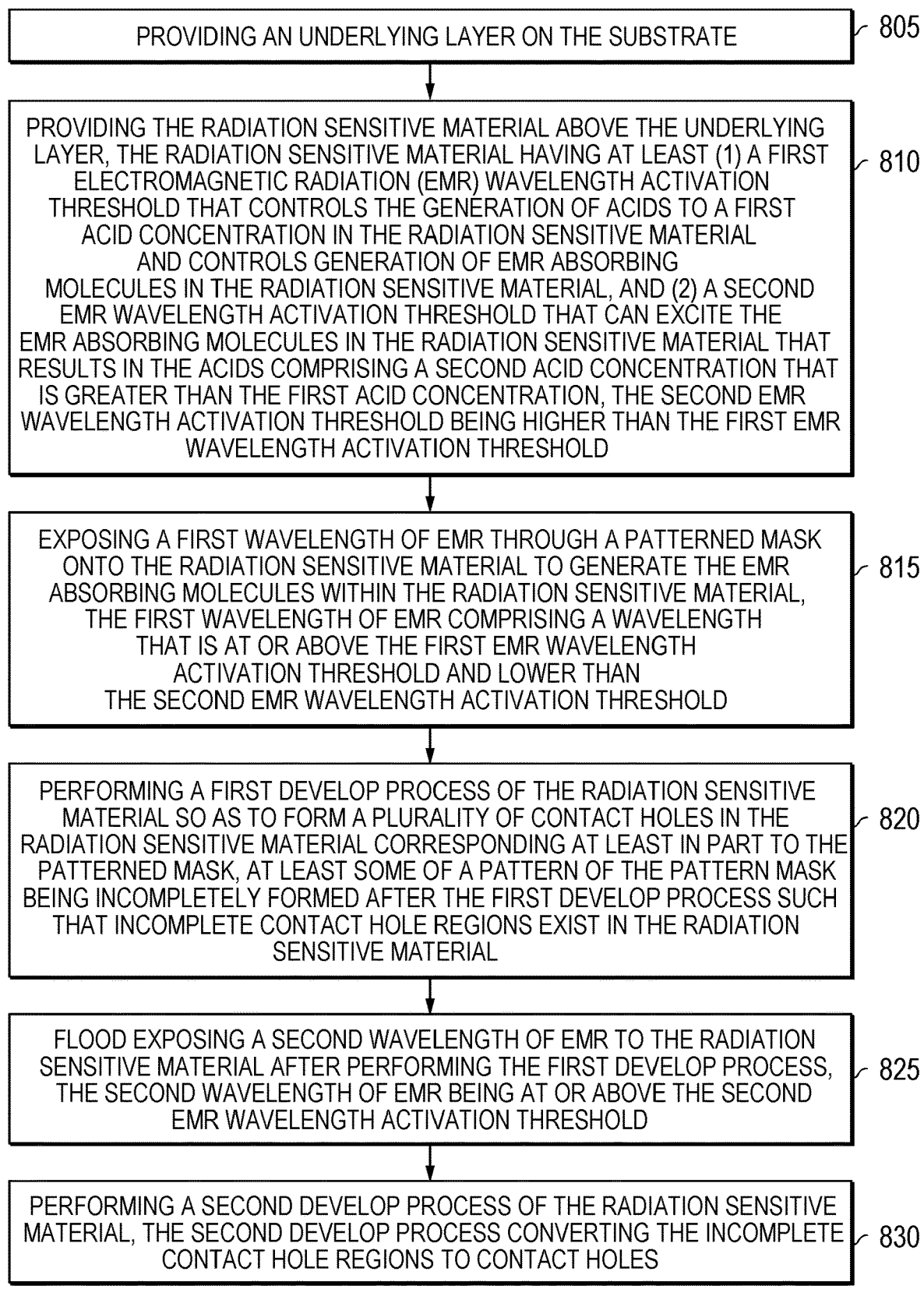
FIGS. 8-10 illustrate exemplary methods for utilizing the process techniques disclosed herein.
Figure 9:
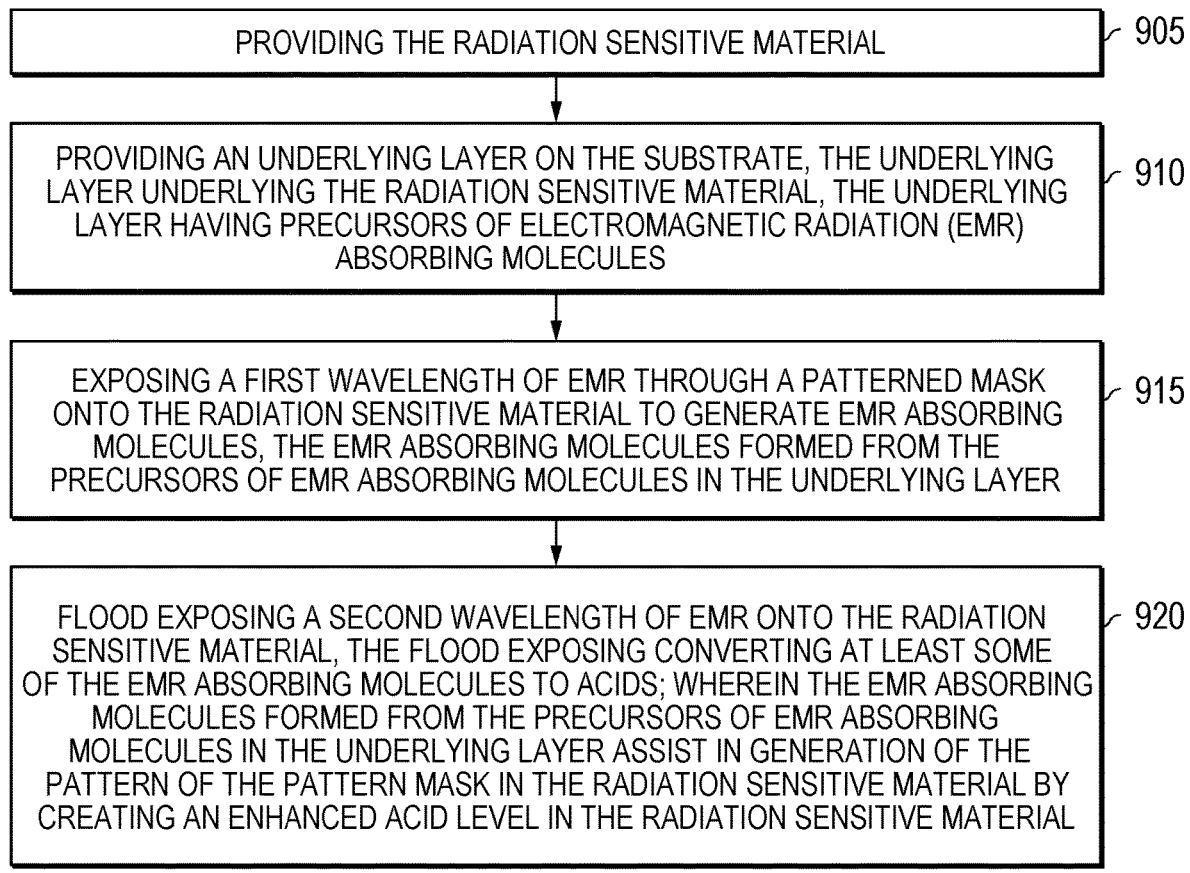
Figure 10:
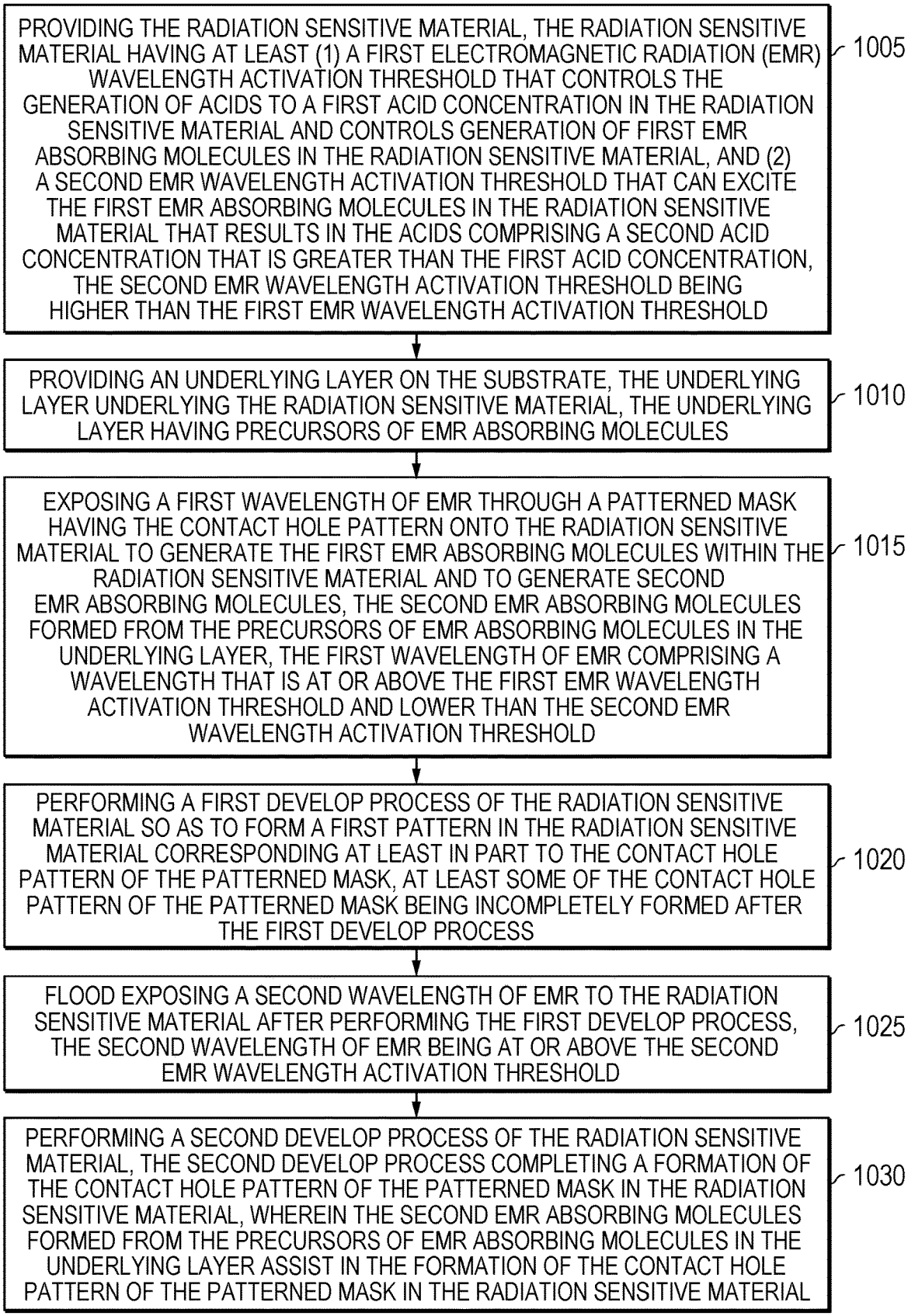

FIGS. 8-10 illustrate exemplary methods for use of the processing techniques described herein. It will be recognized that the embodiments of FIGS. 8-10 are merely exemplary and additional methods may utilize the techniques described herein. Further, additional processing steps may be added to the methods shown in the FIGS. 8-10 as the steps described are not intended to be exclusive. Moreover, the order of the steps is not limited to the order shown in the figure as different orders may occur and/or various steps may be performed in combination or at the same time.

FIG. 8 illustrates a method for forming contact holes in a radiation sensitive material on a substrate. The method comprises a first step 805 of providing an underlying layer on the substrate. A step 810 comprises providing the radiation sensitive material above the underlying layer, the radiation sensitive material having at least (1) a first EMR wavelength activation threshold that controls the generation of acids to a first acid concentration in the radiation sensitive material and controls generation of EMR absorbing molecules in the radiation sensitive material, and (2) a second EMR wavelength activation threshold that can excite the EMR absorbing molecules in the radiation sensitive material that results in the acids comprising a second acid concentration that is greater than the first acid concentration, the second EMR wavelength activation threshold being higher than the first EMR wavelength activation threshold. The method further comprises step 815 of exposing a first wavelength of EMR through a patterned mask onto the radiation sensitive material to generate the EMR absorbing molecules within the radiation sensitive material, the first wavelength of EMR comprising a wavelength that is at or above the first EMR wavelength activation threshold and lower than the second EMR wavelength activation threshold. The method also includes step 820 of performing a first develop process of the radiation sensitive material so as to form a plurality of contact holes in the radiation sensitive material corresponding at least in part to the patterned mask, at least some of a pattern of the pattern mask being incompletely formed after the first develop process such that incomplete contact hole regions exist in the radiation sensitive material. The method further includes step 825 of flood exposing a second wavelength of EMR to the radiation sensitive material after performing the first develop process, the second wavelength of EMR being at or above the second EMR wavelength activation threshold. The method also comprise step 830 of performing a second develop process of the radiation sensitive material, the second develop process converting the incomplete contact hole regions to contact holes.

In another embodiment, FIG. 9 illustrates a method for forming a pattern in a radiation sensitive material on a substrate. The method comprises step 905 of providing the radiation sensitive material and step 910 of providing an underlying layer on the substrate, the underlying layer underlying the radiation sensitive material, the underlying layer having precursors of EMR absorbing molecules. The method further comprises step 915 of exposing a first wavelength of EMR through a patterned mask onto the radiation sensitive material to generate EMR absorbing molecules, the EMR absorbing molecules formed from the precursors of EMR absorbing molecules in the underlying layer. The method also comprises step 920 of flood exposing a second wavelength of EMR onto the radiation sensitive material, the flood exposing converting at least some of the EMR absorbing molecules to acids, wherein the EMR absorbing molecules formed from the precursors of EMR absorbing molecules in the underlying layer assist in generation of the pattern of the pattern mask in the radiation sensitive material by creating an enhanced acid level in the radiation sensitive material.

In still another embodiment, FIG. 10 illustrates a method for forming a contact hole pattern in a radiation sensitive material on a substrate. The method comprises step 1005 of providing the radiation sensitive material, the radiation sensitive material having at least (1) a first EMR wavelength activation threshold that controls the generation of acids to a first acid concentration in the radiation sensitive material and controls generation of first EMR absorbing molecules in the radiation sensitive material, and (2) a second EMR wavelength activation threshold that can excite the first EMR absorbing molecules in the radiation sensitive material that results in the acids comprising a second acid concentration that is greater than the first acid concentration, the second EMR wavelength activation threshold being higher than the first EMR wavelength activation threshold. The method also comprises step 1010 of providing an underlying layer on the substrate, the underlying layer underlying the radiation sensitive material, the underlying layer having precursors of EMR absorbing molecules. The method further comprises step 1015 of exposing a first wavelength of EMR through a patterned mask having the contact hole pattern onto the radiation sensitive material to generate first EMR absorbing molecules within the radiation sensitive material and to generate second EMR absorbing molecules, the second EMR absorbing molecules formed from the precursors of EMR absorbing molecules in the underlying layer, the first wavelength of EMR comprising a wavelength that is at or above the first EMR wavelength activation threshold and lower than the second EMR wavelength activation threshold. The method further includes step 1020 of performing a first develop process of the radiation sensitive material so as to form a first pattern in the radiation sensitive material corresponding at least in part to the contact hole pattern of the patterned mask, at least some of the contact hole pattern of the patterned mask being incompletely formed after the first develop process. The method also comprises step 1025 of flood exposing a second wavelength of EMR to the radiation sensitive material after performing the first develop process, the second wavelength of EMR being at or above the second EMR wavelength activation threshold. The method further includes step 1030 of performing a second develop process of the radiation sensitive material, the second develop process completing a formation of the contact hole pattern of the patterned mask in the radiation sensitive material, wherein the second EMR absorbing molecules formed from the precursors of EMR absorbing molecules in the underlying layer assist in the formation of the contact hole pattern of the patterned mask in the radiation sensitive material.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A method for forming contact holes in a radiation sensitive material on a substrate, comprising:
    providing an underlying layer on the substrate;
    providing the radiation sensitive material above the underlying layer, the radiation sensitive material having at least (1) a first electromagnetic radiation (EMR) wavelength activation threshold that controls the generation of acids to a first acid concentration in the radiation sensitive material and controls generation of EMR absorbing molecules in the radiation sensitive material, and (2) a second EMR wavelength activation threshold that can excite the EMR absorbing molecules in the radiation sensitive material that results in the acids comprising a second acid concentration that is greater than the first acid concentration, the second EMR wavelength activation threshold being higher than the first EMR wavelength activation threshold;
    exposing a first wavelength of EMR through a patterned mask onto the radiation sensitive material to generate the EMR absorbing molecules within the radiation sensitive material, the first wavelength of EMR comprising a wavelength that is at or above the first EMR wavelength activation threshold and lower than the second EMR wavelength activation threshold;
    performing a first develop process of the radiation sensitive material so as to form a plurality of contact holes in the radiation sensitive material corresponding at least in part to the patterned mask, at least some of a pattern of the pattern mask being incompletely formed after the first develop process such that incomplete contact hole regions exist in the radiation sensitive material;
    flood exposing a second wavelength of EMR to the radiation sensitive material after performing the first develop process, the second wavelength of EMR being at or above the second EMR wavelength activation threshold; and
    performing a second develop process of the radiation sensitive material, the second develop process converting the incomplete contact hole regions to contact holes.

2. The method of claim 1, further comprising utilizing a gap-fill coating formed after the first develop process and before the flood exposing to at least partially fill gaps formed on the substrate from the first develop process.

3. The method of claim 2 wherein the radiation sensitive material comprise precursors of EMR absorbing molecules comprising acetophenone, triphenylene, benzophenone, fluorenone, anthraquinone, phenanthrene, xanthone, thioxanthone, other ketone compounds, or derivatives and combinations thereof.

4. The method of claim 2, wherein prior to the flood exposing, the radiation sensitive material has the EMR absorbing molecules, wherein an EMR absorbing molecule concentration profile varies from the top to the bottom of the radiation sensitive material.

5. The method of claim 4, wherein an EMR absorbing molecule concentration is higher at a top of the radiation sensitive material than at a bottom of the radiation sensitive material.

6. The method of claim 4, precursors of EMR absorbing molecules being configured to generate the EMR absorbing molecule concentration profile.

7. The method of claim 4, wherein a topcoat is utilized to generate the EMR absorbing molecule concentration profile.

8. The method of claim 1, wherein prior to the flood exposing, the radiation sensitive material has the EMR absorbing molecules, wherein an EMR absorbing molecule concentration profile varies from the top to the bottom of the radiation sensitive material.

9. A method for forming a pattern in a radiation sensitive material on a substrate, comprising:
    providing the radiation sensitive material;
    providing an underlying layer on the substrate, the underlying layer underlying the radiation sensitive material, the underlying layer having precursors of electromagnetic radiation (EMR) absorbing molecules;
    exposing a first wavelength of EMR through a patterned mask onto the radiation sensitive material to generate EMR absorbing molecules, the EMR absorbing molecules formed from the precursors of EMR absorbing molecules in the underlying layer; and
    flood exposing a second wavelength of EMR onto the radiation sensitive material, the flood exposing converting at least some of the EMR absorbing molecules to acids;
    wherein the EMR absorbing molecules formed from the precursors of EMR absorbing molecules in the underlying layer assist in generation of the pattern of the pattern mask in the radiation sensitive material by creating an enhanced acid level in the radiation sensitive material.

10. The method of claim 9, wherein the pattern is a contact hole pattern.

11. The method of claim 9 wherein the radiation sensitive material also has precursors of EMR absorbing molecules.

12. The method of claim 11, wherein the precursors of EMR absorbing molecules embedded in the underlying layer and the precursors of EMR absorbing molecules in the radiation sensitive material have the same composition.

13. The method of claim 11 wherein the precursors of EMR absorbing molecules embedded in the underlying layer and the precursors of EMR absorbing molecules in the radiation sensitive material have different compositions.

14. The method of claim 11, further comprising performing a first develop process after exposing the first wavelength of EMR through the patterned mask but before the flood exposing and performing a second develop process after the flood exposing.

15. The method of claim 14, wherein the pattern is a contact hole pattern.

16. The method of claim 14, further comprising utilizing a gap-fill coating formed after the first develop process and before the flood exposing to at least partially fill gaps formed on the substrate from the first develop process.

17. The method of claim 9, further comprising performing a first develop process after exposing the first wavelength of EMR through the patterned mask but before the flood exposing and performing a second develop process after the flood exposing.

18. The method of claim 9, further comprising utilizing a gap-fill coating formed after the first develop process and before the flood exposing to at least partially fill gaps formed on the substrate from the first develop process.

19. The method of claim 9, wherein the EMR absorbing molecules are photosensitizer molecules and the precursors of EMR absorbing molecules are photosensitizer precursors.

20. A method for forming a contact hole pattern in a radiation sensitive material on a substrate, comprising:
providing the radiation sensitive material, the radiation sensitive material having at least (1) a first electromagnetic (EMR) wavelength activation threshold that controls the generation of acids to a first acid concentration in the radiation sensitive material and controls generation of first EMR absorbing molecules in the radiation sensitive material, and (2) a second EMR wavelength activation threshold that can excite the first EMR absorbing molecules in the radiation sensitive material that results in the acids comprising a second acid concentration that is greater than the first acid concentration, the second EMR wavelength activation threshold being higher than the first EMR wavelength activation threshold;
providing an underlying layer on the substrate, the underlying layer underlying the radiation sensitive material, the underlying layer having precursors of EMR absorbing molecules;
exposing a first wavelength of EMR through a patterned mask having the contact hole pattern onto the radiation sensitive material to generate the first EMR absorbing molecules within the radiation sensitive material and to generate second EMR absorbing molecules, the second EMR absorbing molecules formed from the precursors of EMR absorbing molecules in the underlying layer, the first wavelength of EMR comprising a wavelength that is at or above the first EMR wavelength activation threshold and lower than the second EMR wavelength activation threshold;
performing a first develop process of the radiation sensitive material so as to form a first pattern in the radiation sensitive material corresponding at least in part to the contact hole pattern of the patterned mask, at least some of the contact hole pattern of the patterned mask being incompletely formed after the first develop process;
flood exposing a second wavelength of EMR to the radiation sensitive material after performing the first develop process, the second wavelength of EMR being at or above the second EMR wavelength activation threshold; and
performing a second develop process of the radiation sensitive material, the second develop process completing a formation of the contact hole pattern of the patterned mask in the radiation sensitive material,
wherein the second EMR absorbing molecules formed from the precursors of EMR absorbing molecules in the underlying layer assist in the formation of the contact hole pattern of the patterned mask in the radiation sensitive material.

21. The method of claim 20, wherein the first EMR absorbing molecules and the second EMR absorbing molecules have the same composition.

22. The method of claim 20, further comprising utilizing a gap-fill coating formed after the first develop process and before the flood exposing to at least partially fill gaps formed on the substrate from the first develop process.

23. The method of claim 20, wherein the first EMR absorbing molecules are first photosensitizer molecules, the second EMR absorbing molecules are second photosensitizer molecules, and the precursors of EMR absorbing molecules are photosensitizer precursors.

24. The method of claim 9 wherein before flood exposing, the method further comprises: performing a first develop process of the radiation sensitive material to form a pattern, the pattern including an incompletely formed feature after the first develop process.

* * * * *

UNITED STATES PATENT AND TRADEMARK OFFICE
CERTIFICATE OF CORRECTION

| | |
|---|---|
| PATENT NO. | : 11,163,236 B2 |
| APPLICATION NO. | : 16/993594 |
| DATED | : November 2, 2021 |
| INVENTOR(S) | : Michael A. Carcasi |

It is certified that error appears in the above-identified patent and that said Letters Patent is hereby corrected as shown below:

In the Specification
Column 2, Line 31, "disclosed U.S. Pat. No." should be --disclosed in U.S. Pat. No.--.
Column 2, Lines 46-49, "The critical dimension control techniques of ... include of a first develop process" should be --The critical dimension control techniques of ... include a first develop process--.
Column 7, Lines 25-26, "The method then comprise flood exposing a second wavelength" should be --The method then comprises flood exposing a second wavelength--.
Column 7, Lines 66-67, "FIG. 3 illustrates the cross-section FIG. 2 after flood exposure." should be --FIG. 3 illustrates the cross-section of FIG. 2 after flood exposure.--.
Column 8, Line 45, "will be recognized that the though certain embodiments are" should be --will be recognized that though certain embodiments are--.
Column 11, Lines 13-16, "In this embodiment, the photosensitizer generated from ... are created in the missing" should be --In this embodiment, the photosensitizer generated from ... is created in the missing--.
Column 11, Lines 27-29, "As described above, a process flow of a first ..., a first develop step, an unpatterned flood ... and a second develop step is provided." should be --As described above, a process flow of a first..., a first develop step, an unpatterned flood ... and a second develop step are provided.--.
Column 11, Lines 47-49, "Optionally, after the first develop step, ... gaps in the patterned formed in the resist" should be --Optionally, after the first develop step, ... gaps in the pattern formed in the resist--.
Column 14, Line 32, "and will tend to drive material segregation affects." should be --and will tend to drive material segregation effects--.
Column 16, Lines 2-3, "The method also comprise step 830 of" should be --The method also comprises step 830 of--.

In the Claims
Column 18, Lines 1-2, Claim 3, "The method of claim 2 wherein the radiation sensitive material comprise precursors of" should be --The method of claim 2 wherein the radiation sensitive material comprises precursors of--.

Signed and Sealed this
Tenth Day of May, 2022

*Katherine Kelly Vidal*
Katherine Kelly Vidal
*Director of the United States Patent and Trademark Office*